(12) United States Patent
Plaze et al.

(10) Patent No.: US 7,911,270 B2
(45) Date of Patent: Mar. 22, 2011

(54) BROADBAND MICROWAVE DEVICE WITH SWITCHABLE GAIN

(75) Inventors: Jean-Philippe Plaze, Bois D'Arcy (FR); Claude Auric, Chateaufort (FR); Philippe Dueme, Orsay (FR)

(73) Assignee: Thales (FR)

( * ) Notice: Subject to any disclaimer, the term of this patent is extended or adjusted under 35 U.S.C. 154(b) by 23 days.

(21) Appl. No.: 12/548,668

(22) Filed: Aug. 27, 2009

(65) Prior Publication Data

US 2010/0052788 A1   Mar. 4, 2010

(30) Foreign Application Priority Data

Aug. 29, 2008   (FR) ..................... 08 04764

(51) Int. Cl.
*H03F 1/14* (2006.01)
*H03F 3/60* (2006.01)
(52) U.S. Cl. ..................... 330/51; 330/286; 330/295
(58) Field of Classification Search ............... 330/51, 330/286, 295
See application file for complete search history.

(56) References Cited

U.S. PATENT DOCUMENTS

| 4,755,769 | A | 7/1988 | Katz |
| 6,094,099 | A | 7/2000 | Kobayashi |
| 6,900,695 | B2 * | 5/2005 | Ouacha ................. 330/295 |
| 7,782,140 | B2 * | 8/2010 | Shigematsu ............ 330/286 |
| 2004/0056710 | A1 | 3/2004 | Pozdeev |

FOREIGN PATENT DOCUMENTS

| EP | 1345322 | 9/2003 |
| GB | 2219702 | 12/1989 |

* cited by examiner

*Primary Examiner* — Steven J Mottola
(74) *Attorney, Agent, or Firm* — Stroock & Stroock & Lavan LLP

(57) ABSTRACT

The invention relates to a broadband microwave device with switchable gain comprising a microwave signal input E and output S, a distributed amplifier with a plurality of amplifying cells comprising an input transmission line for an input signal applied to the microwave signal input E, said input transmission line having one of its two ends linked to the microwave signal input E, an output transmission line for said amplified input signal having an output end of the distributed amplifier, the cells of the distributed amplifier settable either to an amplifying state or to a blocked state. A switch switches the microwave signal output S either to a non-amplification position linked to the other end of the input transmission line, or to an amplification position linked to the output end of the distributed amplifier. A control unit supplies switch position control and amplifying cell status control signals.

6 Claims, 4 Drawing Sheets

OFF: Amplifying cells in the blocked state

BROADBAND MICROWAVE DEVICE WITH SWITCHABLE GAIN

CROSS REFERENCE TO RELATED APPLICATIONS

The present application claims priority to French Patent Application Serial No. 08/04764, filed on Aug. 29, 2008, the contents of which are hereby incorporated by reference in its entirety.

FIELD OF THE INVENTION

The invention relates to a broadband active device for microwave integrated circuits providing gain switching functions.

BACKGROUND OF THE INVENTION

The transmission and reception subsystems produced for example using MMIC (Monolithic Microwave Integrated Circuits) technology, generally comprise one or more gain control cells that are used to adapt, for example in the case of a radiofrequency transmission subsystem, the desired output level and, in the case of a reception subsystem, the gain of the subsystem at the received signal level.

In practice, a gain control of the transmission and/or reception subsystem is sought that offers a minimum of distortion of the signal processed by the subsystem and of degradation of the noise figure.

Currently, there are a number of solutions in the state of the art of integrated circuits for adjusting the level of the signal in a microwave subsystem:
  either by the use of an amplifier that will be switched depending on whether or not amplification of the signal is desired in the subsystem,
  or by the use of an attenuator that will be activated or not activated depending on whether it is necessary or not necessary to weaken the signal in the microwave subsystem.

The choice of amplification or attenuation of the signal in the subsystem generally leads to the amplifier or attenuator being inserted between two simultaneously-controlled switches making it possible to choose one channel out of two for the signal so as to activate or not activate the function concerned.

FIGS. 1a and 1b show gain adjusting electronic devices of the state of the art in a microwave subsystem. These gain adjusting devices are also respectively designated by the terms "gain terminals" and "attenuation terminals".

FIG. 1a shows the case of use of a microwave amplifier G 10 between two switches simultaneously controlled in order to make it possible to choose one channel out of two for the signal, an input switch C1 and an output switch C2. The common points 12 of the switches C1, C2 are respectively linked, one to the input E of the device and the other to the output S of the device.

The switches C1 and C2, set to the amplification position, respectively apply an input signal Ue received at the input E of the electronic gain adjusting device, to an input eA of the amplifier and an output signal Us supplied by an output sA of the amplifier to the output S of the device.

In position of transmission without amplification of the input signal Ue to the output S of the device, the switches C1 and C2 directly link the input E to the output S via a conductor 20, therefore without any amplification but with transmission losses imparted by the switches and the electrical connections.

FIG. 1b shows a gain adjusting device with the switches C1, C2 as represented in FIG. 1a but using an attenuator Att 24 in place of the amplifier G 10.

In the case where these gain adjusting devices of the state of the art are placed close to a receiving antenna, for example to drive a radiofrequency receiver, the amplifier device of FIG. 1a is given preference so as not to degrade the noise figure NF of the receiver.

Nevertheless, the use of switches C1, C2 to produce the function of FIG. 1a leads, through the high-frequency losses that they introduce, to a degradation of the noise figure NF of the receiver. In practice, since the switches are passive structures, the losses of the input switch C1 (expressed in dB) are directly added to the noise figure NF (in dB) of the rest of the device, in other words the amplifier G 10 and the switch C2 linked to the output S of the device.

Furthermore, the use of two switches C1 and C2 to produce these gain adjusting devices leads to an increase in the losses of the microwave subsystem regardless of whether the device (or the path travelled by the signal in the subsystem) is configured to maximum gain or to minimum gain. In practice, of the two devices providing gain adjusting functions in FIGS. 1a and 1b, only the losses of the switches C1 and C2 in the attenuation mode of FIG. 1b can be compensated by an equivalent reduction in the value of the attenuator Att, but this is then done to the detriment of the gain difference between the two switched channels (direct transmission channel via the conductor 20 and attenuation channel via the attenuator Att).

FIG. 1c shows a gain adjusting device with switches C1, C2 as represented in FIGS. 1a and 1b also comprising two switched channels. The first channel contains an amplifier G 10, the second an attenuator Att 24. This solution makes it possible to increase, if necessary, the gain difference between the two states of the device but changes nothing with the drawback of increasing the noise figure due to the losses of the input switch C1.

In the case of a radiofrequency reception subsystem that uses a number of gain adjusting devices to manage the dynamics of the signal in the radiofrequency subsystem, it is ultimately necessary to add one or more other amplifiers to compensate all the losses of these devices.

In the state of the art of radiofrequency receivers, there is no ideal solution for avoiding a degradation of the noise figure.

However, to obtain a good noise figure NF, the reception subsystems of the state of the art usually include a low-noise amplifier (LNA) at the head of the reception subsystem, without the possibility of switching it, which has the drawback, in the case of the reception of strong signals, of introducing distortions of the received signal but also a degradation of the characteristics of the receiver, even destruction of said receiver.

SUMMARY OF THE INVENTION

To overcome the drawbacks of the gain adjusting devices of the state of the art, the invention proposes a broadband microwave device with switchable gain comprising a microwave signal input E and output S, a distributed amplifier with n amplifying cells (Cl1, Cl2, ... Cli, ... Cln) comprising an input transmission line (Lg) for an input signal Ue applied to the microwave signal input E, said input transmission line having one of its two ends (ec1) linked to the microwave signal input E, an output transmission line (Ld) for said amplified input signal Ue having an output end (Sd) of the distributed amplifier, the amplifying cells of the distributed amplifier being able to be set either in an amplifying state or in a blocked state, characterized in that it comprises a two-channel-to-one-channel switch (C2) comprising a control input to be switched, either to a non-amplification position then linking the microwave signal output S to the other end (Em) of the input transmission line (Lg) to transmit to said output S the input signal (Ue), or to an amplification position linking said signal output S to the output end (Sd) of the distributed amplifier, to transmit to the microwave signal output S an amplified input signal (Ue), a control unit UC supplying two-channel-to-one-channel switch (C2) position and amplifying cell status control signals.

Advantageously, each amplifying cell comprises an amplified signal microwave input and output, a control input to be set, either to an amplifying state and supply an amplified signal at the microwave output of the cell, or to a blocked state to isolate the output of the cell from its input.

In one embodiment, the device includes a terminating impedance Zg and in that, when the two-channel-to-one-channel switch (C2) is in the amplification position, the amplifying cells are set to the amplifying state, the other end (Em) of the input transmission line (Lg) being connected to a reference potential (M) via the terminating impedance Zg and, when the switch is in the non-amplification position, the amplifying cells are set to the blocked state, the end (Em) of the input transmission line (Lg) then being disconnected from the terminating impedance Zg.

In one exemplary embodiment, each amplifying cell is produced on the basis of transistors such as bipolar transistors or field-effect transistors.

In another embodiment, the two-channel-to-one-channel switch (C2) is produced by at least two transistors.

In another exemplary embodiment of the device, the two-channel-to-one-channel switch (C2) is produced using two cold field-effect transistors (FET), an FET T1 connected by its drain D to the other end (Em) of the input transmission line (Lg) for the input signal and by its source S to the microwave signal output S, an FET T2 connected by its drain D to the output end (Sd) of the distributed amplifier and by its source S to said microwave signal output S, and an FET T3 is connected by its drain D to the common point between the other end (Em) of the input transmission line (Lg) and the drain D of the FET T1 via a terminating impedance Zg of the input transmission line (Lg) and by its source to a reference potential (M).

The cold FETs are field-effect transistors with a DC voltage between the drain and source that is always zero.

The invention proposes to eliminate the input switch C1 of the gain adjusting devices of the state of the art by a solution that consists in using the physical characteristics of a distributed amplifier.

FIG. 2 shows a diagram of a simple distributed amplifier of the state of the art comprising n amplifying cells Cl1, Cl2, ... Cli, ... Cln, (i being a number between 1 and n), for example produced using field-effect transistors (FET). The distributed amplifier includes a broadband radiofrequency input Eg and output Sd.

The simple distributed amplifier of FIG. 2 includes an input transmission line Lg, linked to the input Eg, actively coupled to an output transmission line Ld via active ceils Cli. In the particular case of producing active ceils Cli with field-effect transistors (FET), the input transmission line Lg can also be designated "gate line", since it is then the gates of the transistors of the amplifying cells that are concentrated thereto and, in this same case, the output transmission line Ld can be called "drain line" since it is the drains of the transistors of said amplifying cells that are connected thereto.

The active coupling between these two lines Lg and Ld can be produced either by transistors alone or by more complex amplifying cells, for example a cascode configuration or a cascade configuration.

The gate Lg and drain Ld lines are each loaded by a terminating impedance, respectively Zg and Zd, contributing to the impedance matching to the respective ports Eg and Sd of the device.

In a conventional distributed structure, a radiofrequency signal Ue incoming through an end Eg of the gate line Lg is propagated along said line and is actively coupled to the drain line Ld through amplifying cells Cl1, Cl2, ... Cli, ... Cln, distributed all along these two lines. The input signal Ue amplified at the output of the amplifying cells is phase-recombined on the drain line Ld to be propagated towards the output Sd.

A main aim of the invention is to eliminate the input switch C1 of the gain adjusting devices as described in FIGS. 1a, 1b or 1c.

Another aim is to obtain a gain adjusting microwave device that offers a very low noise figure.

BRIEF DESCRIPTION OF THE DRAWINGS

The invention will be better understood from exemplary embodiments of a broadband microwave device with switchable gain and a method for implementing said device, with reference to the appended drawings in which.

DETAILED DESCRIPTION OF EMBODIMENTS

Figure 1A:
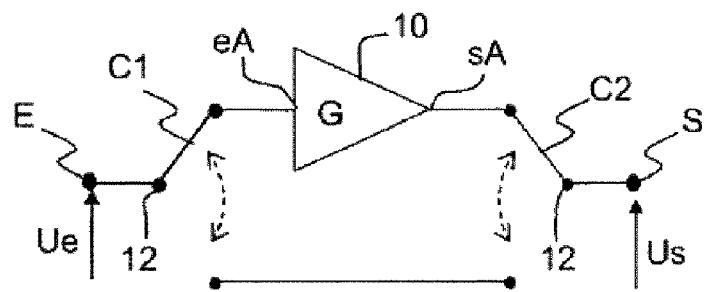
FIGS. 1a, 1b and 1c, already described, show electronic gain adjusting devices of the state of the art.
Figure 1B:
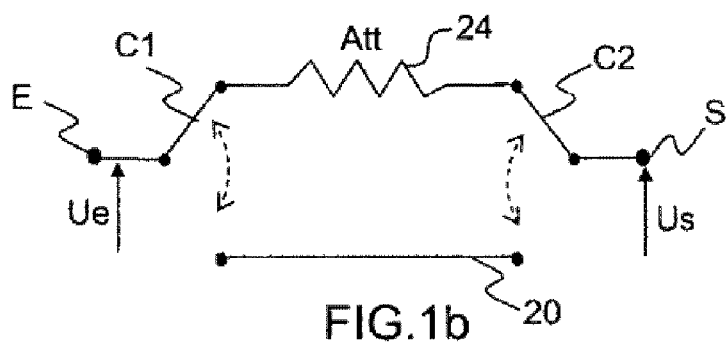
Figure 1C:
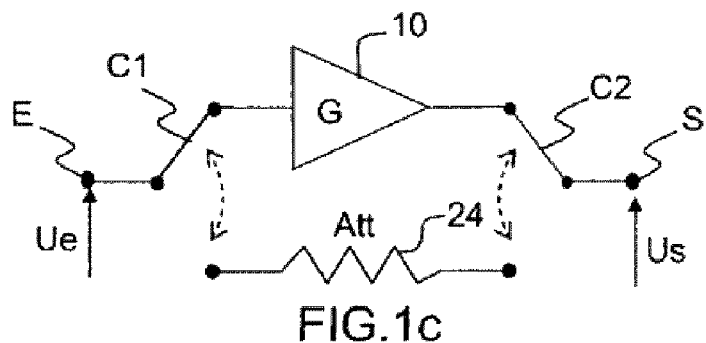
Figure 2:
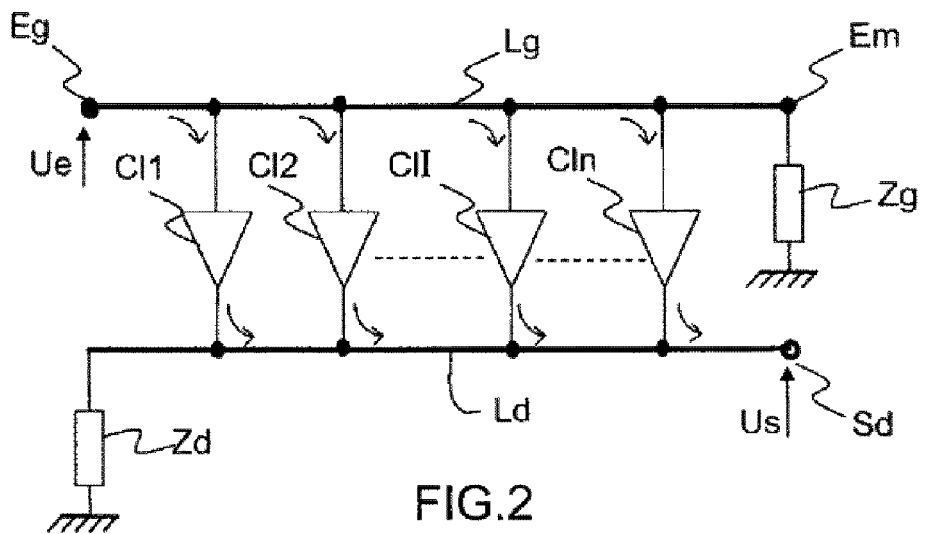
FIG. 2, already described, is a diagram of a simple distributed amplifier of the state of the art comprising n amplifying cells.
Figure 3A:
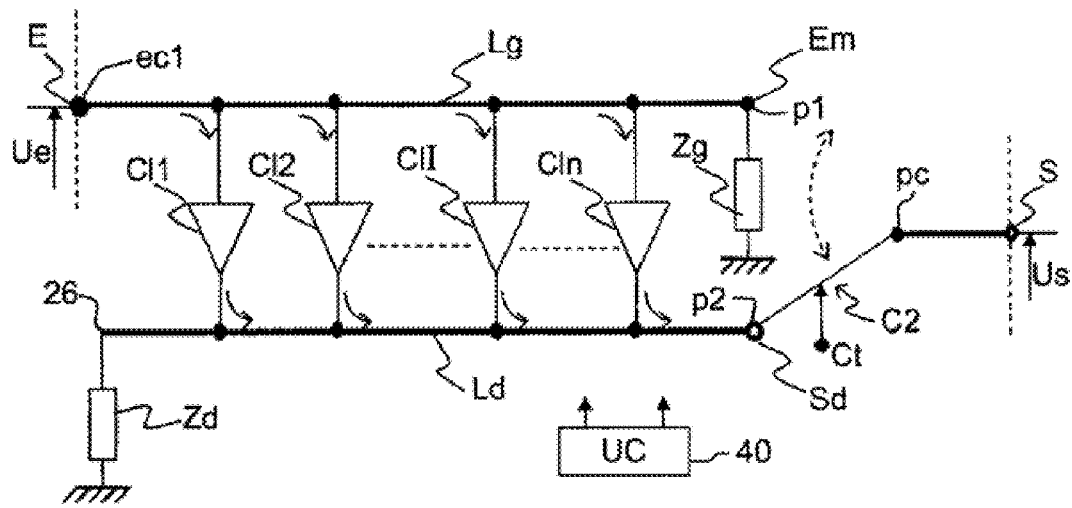
FIGS. 3a and 3b are schematic diagrams of the 2 operating modes of a broadband microwave device with switchable gain according to the invention.
Figure 3B:
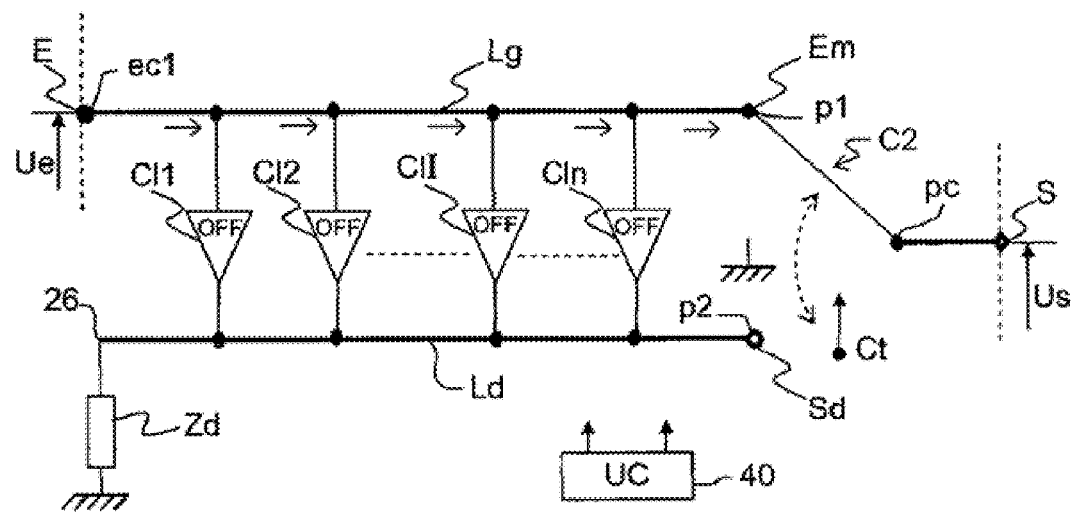

The broadband microwave device with switchable gain of FIGS. 3a and 3b comprises:
- a microwave input E and output S of the device,
- a distributed amplifier with n amplifying cells Cl1, Cl2, ... Cli ... Cln, comprising an input transmission line Lg for an input signal Ue applied to the microwave signal input E and an output transmission line Ld for the amplified input signal;
- a switch C2 of the two-channel-to-one-channel type, having a common terminal pc and two terminals p1, p2 for choosing the channel to be switched. This switch C2 will hereinafter be designated more simply "2-to-1 switch".

The input transmission line Lg has one of its two ends ec1 linked to the input E of the device and the other end Em linked on the one hand to the terminal p1 of the switch C2 and on the other hand to a switchable terminating impedance Zg. The term "switchable terminating impedance Zg" should be understood to mean an impedance Zg associated with a switching means in order to be able to close or not close the input transmission line Lg to this impedance Zg.

The output transmission line Ld for said input signal Ue amplified by the n amplifying cells has an output end Sd of the distributed amplifier linked to the other terminal p2 of the switch C2. The other end 26 of the output transmission line Ld is loaded with a terminating impedance Zd.

The switch C2 has a control input Ct to be switched, either to a non-amplification position (see FIG. 3b), the common terminal pc being linked to the terminal p1 of the switch C2, or to an amplification position (see FIG. 3a), the common terminal pc being linked to the terminal p2 of the switch C2.

In the distributed amplifier of the broadband microwave device with switchable gain according to the invention, the terminating impedance Zg of the input transmission line Lg for the input signal must be modified to be able to switch it and use the distributed structure associated with an output switch to perform the switching between the amplified state and the non-amplified state. For this, the distributed amplifier must offer two operating modes.

FIG. 3a shows the broadband microwave device with switchable gain according to the invention in a first operating mode.

The first operating mode is an amplifying mode for which the amplifying cells Cl1, Cl2, . . . Cli, . . . Cln are activated (or in the amplifying state). In this amplifying mode, the output end Sd of the distributed amplifier is linked, through the switch C2, to the output S of the device, to transmit to the microwave output S the input signal Ue amplified by the amplifying cells, or the output signal Us. Furthermore, in this amplifying mode, the input transmission line Lg for the input signal is loaded at its other end Em by a terminating impedance Zg.

In the first operating mode, the input radiofrequency signal Ue, applied to the input ec1 of the distributed amplifier, is propagated along the input transmission line Lg, is broken down into elementary signals, each elementary signal is amplified by an active cell Cli, all of the amplified elementary signals being phase-recombined on the output transmission line Ld towards the end Sd of said line.

FIG. 3b shows the broadband microwave device with switchable gain according to the invention in a second operating mode.

The second operating mode, or non-amplifying mode, is a mode for which the amplifying cells of the distributed structure are off, or in a so-called blocked state. In this non-amplifying mode, the other end Em of the transmission line Lg for the input signal Ue is linked, through the switch C2, to the output S of the device to transmit, without amplification, the signal Ue applied to its input E.

In this non-amplifying mode, the input transmission line Lg is then isolated from the output transmission line Ld. The radiofrequency signal Ue incoming through the input E of the microwave device is propagated along the input transmission line Lg and can then be recovered at the other end Em of said line subject to its being isolated from its terminating impedance Zg.

The switch C2, ideally placed between the end Em of the input transmission line Lg and the output end Sd of the output transmission line Ld, makes it possible to recover, depending on its position, either the amplified signal Ue or the non-amplified signal Ue (transmission losses apart).

The position of the switch C2 and the state of the amplifying cells Cl1, Cl2, . . . Cli, . . . Cln, must be synchronized. To this end, the broadband microwave device with switchable gain includes a control unit UC 40 supplying control signals to the switch C2, to the switchable terminating impedance Zg and to the amplifying cells Cli.

In a transmission state without amplification (or non-amplification) of the microwave device (see FIG. 3b):
the control unit UC simultaneously supplies, on the one hand, a command to the switch C2 to set it to the non-amplification position linking the end Em of the input transmission line Lg for the input signal to the output S of the microwave device, and a command to isolate the switchable terminating impedance Zg from the input signal transmission line Lg and, on the other hand, a command to set all the amplifying cells Cl1, Cl2, . . . Cli, . . . Cln to the blocked state, isolating the first transmission line Lg from the second transmission line Ld.

In an amplification state of the broadband microwave device with switchable gain with amplification of the input signal Ue (see FIG. 3a):
the control unit UC 40 simultaneously supplies, to the switch C2, to the switchable terminating impedance Zg and to the amplifying cells Cl1, Cl2, . . . Cli, . . . Cln, additional commands to set the switch C2 to the amplifying state linking the output end Sd of the output transmission line Ld for the amplified input signal at the output S of the microwave device, to connect the terminating impedance Zg to the other end Em of the input transmission line Lg and to set all the amplifying cells to the amplifying state supplying the amplified Input signal (signal Us) at the output S of the microwave device.

This architecture for a broadband microwave device with switchable gain according to the invention offers the benefit of eliminating the input switch C1 from the structure of the gain terminal of the state of the art, which has a direct impact, on the one hand, on the gain level of the amplified and non-amplified channels (without in any way modifying the gain difference between these channels) and, above all, on the noise figure NF of the microwave device since said noise figure is reduced by the level of losses of the input switch C1 of the devices of the state of the art.

Figure 4:
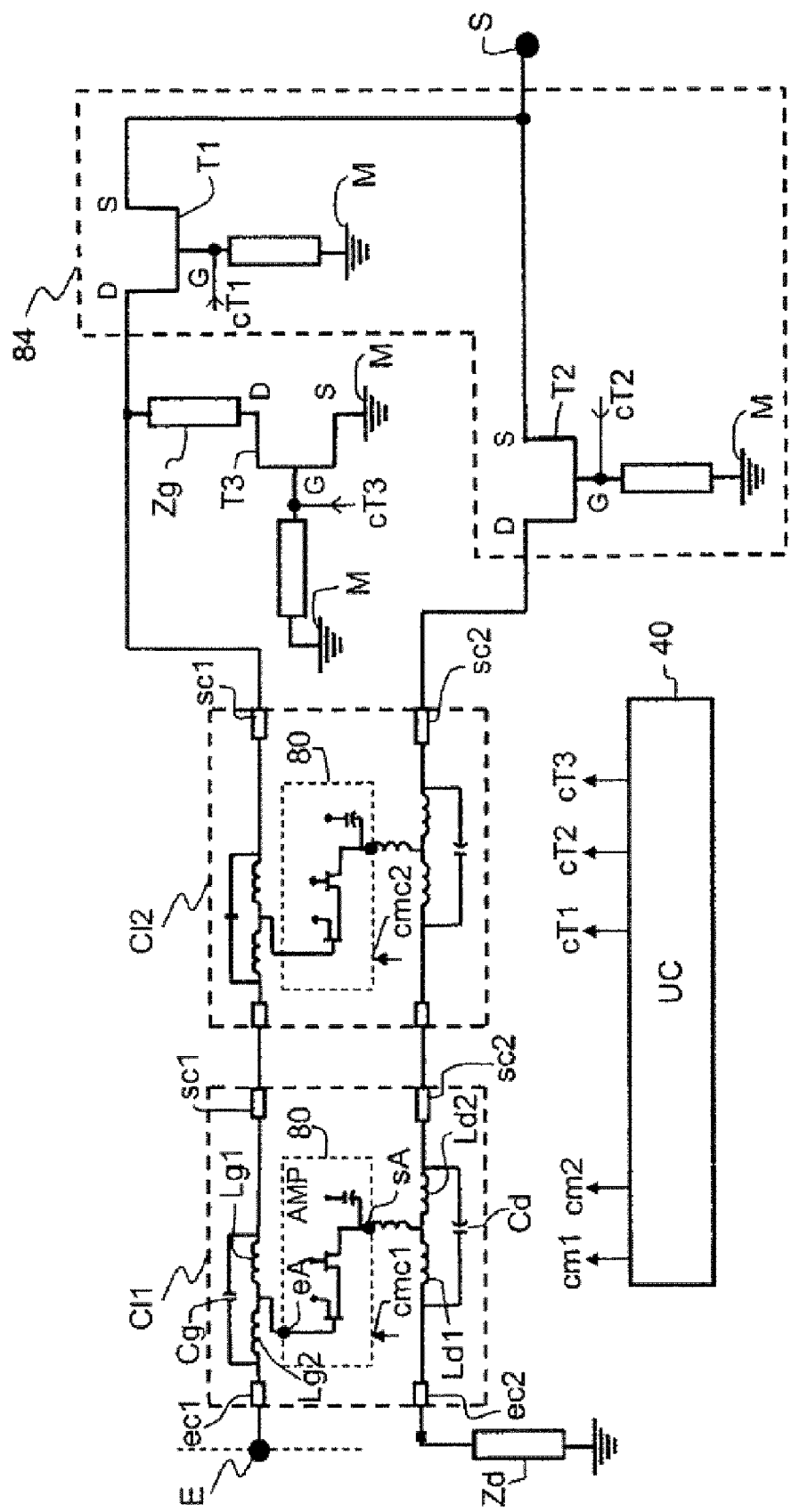
FIG. 4 shows a practical exemplary embodiment of a broadband microwave device with switchable gain according to the invention.

FIG. 4 shows a practical exemplary embodiment of a broadband microwave device with switchable gain according to the invention.

The microwave device of FIG. 4 has a first amplifying cell Cl1 cascade-connected with a second amplifying cell Cl2 using field-effect transistors (FET).

Each of the two amplifying cells Cl1, Cl2 includes, between an input ec1 and an output sc1 of the cell, a half-gate line Lg formed by a capacitor Cg in parallel with two series inductances L1g, L2g. Between another input ec2 and another output sc2, a half-drain line Ld with the same structure as the half-gate line Lg of the microwave device including another capacitor Cd and two other inductances L1d, L2d, an amplifying cell AMP 80 with field-effect transistors including an input eA and an output sA.

The input eA of the amplifier is connected to the common point between the two inductances L1g, L2g, of the half-gate line Lg of the cell concerned and its output sA is connected to the common point between the two inductances L1d, L2d of the half-drain line Ld of said cell.

The two cascade-connected cells Cl1, Cl2 form a distributed amplifier. To this end, the input ec1 of the half-gate line of the first cell Cl1 is connected to the input E of the broadband microwave device with switchable gain, the other input ec2 of the half-drain line of the first cell Cl1 is connected to a terminating impedance Zd of the drain line.

The output sc1 of the half-gate line and that sc2 of the half-drain line of the second cell Cl2 are connected to a switching circuit 84 with cold FETs producing the switch C2 of FIGS. 3a and 3b. The expression "cold FET" should be understood to mean a field-effect transistor for which there is no DC voltage applied between its drain D and its source S. Depending on the DC voltage applied between the gate G and the source S (or the drain D) of the cold transistor, the latter offers a variable resistance between its drain and its source which gives it the characteristics of a switch. On the other hand, the output sc1 of the half-gate line of the second cell Cl2 is also connected to the switchable terminating impedance Zg.

The output sc1 of the half-gate line and that sc2 of the half-drain line of the first cell Cl1 are respectively connected to the input ec1 of the half-gate line and the input ec2 of the half-drain line of the second cell Cl2.

The switching circuit 84, or the switch C2, includes a cold FET T1 connected by its drain D on the one hand to the output sc1 of the half-gate line of the second cell Cl2 and on the other hand to one end of the terminating impedance Zg and by its source S to the output S of the microwave device, a cold FET T2 connected by its drain D to the output sc2 of the half-drain line of the second cell Cl2 and by its source S to said output S of the microwave device. FETs T1 and T2 thus form the 2-to-1 type switch C2 of the broadband microwave device with switchable gain.

Another cold FET T3 is connected, by its drain, to the other end of the terminating impedance Zg of the input transmission line Lg for the input signal and, by its source, to a reference potential, for example a ground M of the broadband microwave device with switchable gain, in order to allow for the switching of the terminating impedance Zg.

Each of the two amplifying cells has a control input cmc1, cmc2 to set the amplifying cells AMP 80 either to an amplifying state or to a blocked state thus isolating their radiofrequency input eA from their output sA.

The control unit UC supplies respective control signals cT1, cT2, cT3 to the gates of the cold FETs T1, T2, T3 and the control signals cm1, cm2 to drive the respective control inputs cmc1, cmc2 of the amplifying cells AMP 80 and control the state of the two cells Cl1, Cl2.

It may be recalled that, with respect to the cold FETs T1, T2 and T3, the gate electrode G of the FET is not used as a control electrode and is not directly involved In the microwave mode operation of the circuit. The cold FETs T1, T2 and T3 operate as switches and the source and drain of each cold FET in the configuration of FIG. 4 can be reversed.

In this exemplary embodiment, the amplifying cells AMP 80 and the switch C2 are produced using field-effect transistors. It is quite possible to envisage producing the inventive device using other types of transistors, such as, for example, bipolar transistors, or to produce the amplifying cells with one type of transistor and the switch C2 with another type of transistor.

Figure 5A:
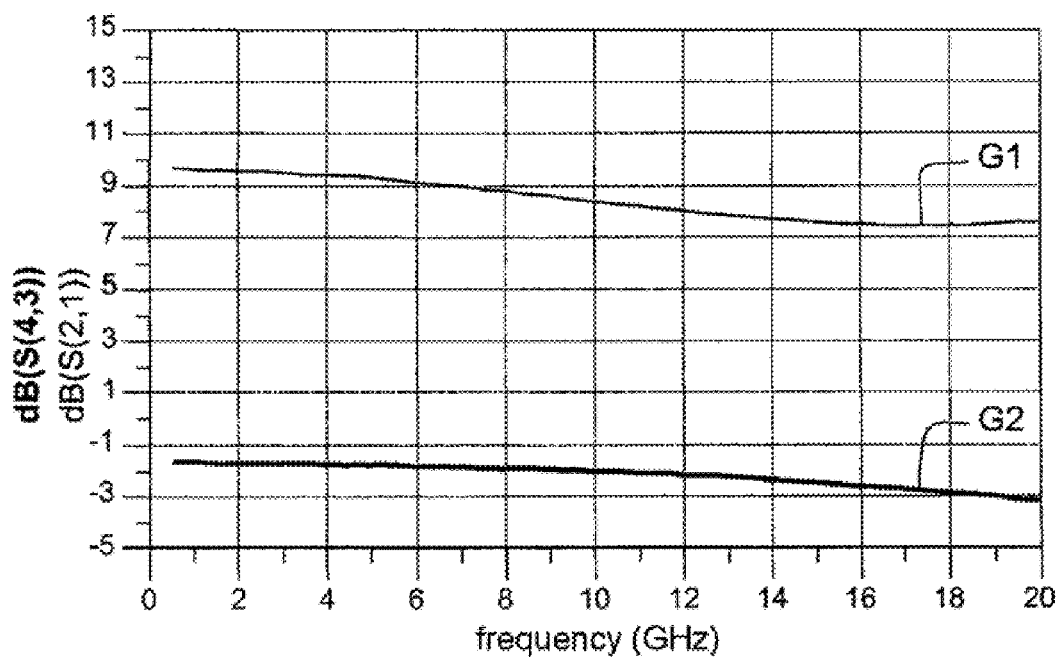
FIGS. 5a and 5b respectively show gain characteristics according to the 2 operating states and the gain difference between these 2 operating states, as a function of the operating frequency of the microwave device of FIG. 4.
Figure 5B:
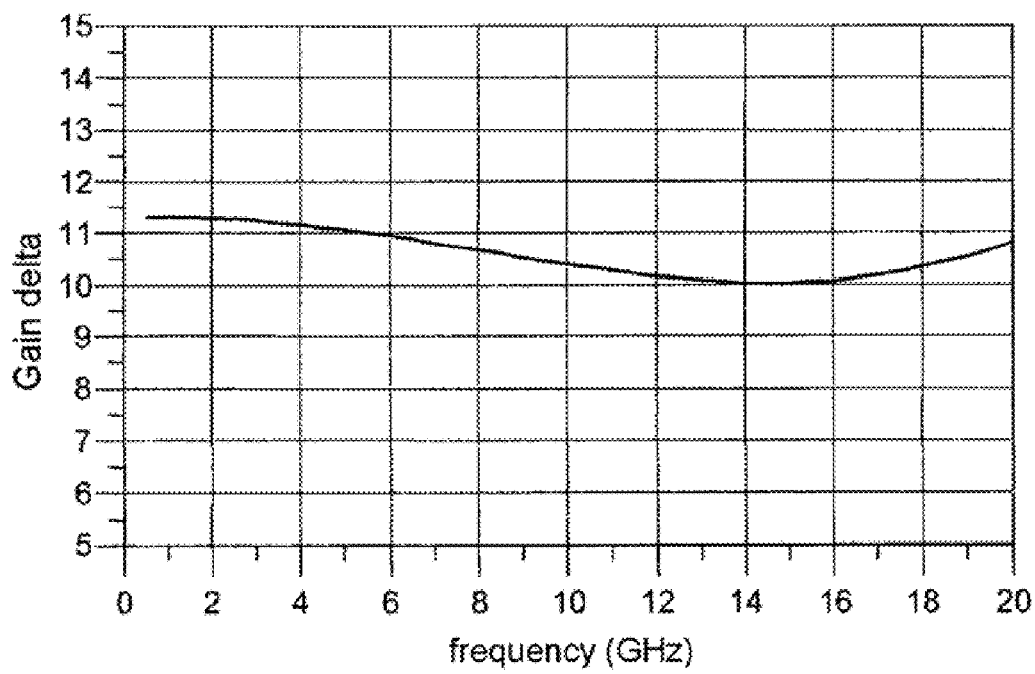

FIGS. 5a and 5b respectively show gain characteristics according to the 2 operating states and the gain difference between these 2 operating states, as a function of the operating frequency of the broadband microwave device with switchable gain of FIG. 4 according to the invention.

FIG. 5a has a first curve G1 showing the variation of the gain (in dB) as a function of the operating frequency (in GHz) of the inventive microwave device controlled in the amplification state. The curve G2 shows the attenuation of the microwave device controlled in the non-amplification state. This attenuation represents the transmission losses of the gate line Lg of the device and of the switch circuit 84 when said circuit is in non-amplification mode.

FIG. 5b shows the gain difference between the two operating modes of the device.

The invention claimed is:

1. Broadband microwave device with switchable gain, comprising:
    a microwave signal input to the broadband microwave device, to accept an input signal;
    an input transmission line having a first end and a second end, the first end connected to the microwave signal input;
    an output transmission line having a first end and a second end; and
    a distributed amplifier with a plurality of parallel amplifying cells, each amplifying cell having an amplifying cell input connected to the input transmission line, and having an amplifying cell output connected to the output transmission line, wherein the second end of the output transmission line forms a distributed amplifier output,
    wherein one or more of the parallel amplifying cells are settable to one of an amplifying state and a blocked state;
    the broadband microwave device further comprising a two-channel-to-one-channel switch, the switch comprising:
        a first switch input connected to the second end of the input transmission line;
        a second switch input connected to the second end of the output transmission line;
        a switch output forming an output of the broadband microwave device; and
        a control input to change a position of the switch between a non-amplifying position and an amplifying position, the non-amplifying position comprising the first switch input connected to the switch output, and the amplifying position comprising the second switch input connected to the switch output
    the broadband microwave device further comprising a control unit to supply a control signal to the control input of the switch and to supply status control signals to one or more amplifying cells.

2. Microwave device according to claim 1, wherein each amplifying cell comprises:
    an amplifying cell input that forms an amplified signal microwave input;
    an amplifying cell output; and
    an amplifying cell control input to set the amplifying cell either to an amplifying state to supply an amplified signal at the amplifying cell output, or to a blocked state to isolate the amplifying cell output from the amplifying cell input.

3. Microwave device according to claim 2, further comprising a terminating impedance, wherein:
    when the two-channel-to-one-channel switch is in the amplifying position, the amplifying cells are set to the amplifying state and the second end of the input transmission line is connected to a reference potential via the terminating impedance; and
    when the two-channel-to-one-channel switch is in the non-amplifying position, the amplifying cells are set to the blocked state and the second end of the input transmission line is disconnected from the terminating impedance.

4. Microwave device according to claim 1, wherein each amplifying cell comprises transistors selected from the group consisting of bipolar transistors and field-effect transistors.

5. Microwave device according to claim 1, wherein the two-channel-to-one-channel switch comprises at least two transistors.

6. Microwave device according to claim 3, wherein the two-channel-to-one-channel switch comprises:

a first field-effect transistor having a drain connected to the second end of the input transmission line, connected to the output of the broadband microwave device, and a gate connected to a reference potential through a resistance; and a second field-effect transistor, having a drain connected to the distributed amplifier output, a source connected to the output of the broadband microwave device, and a gate connected to the reference potential through a resistance, wherein a third field-effect transistor has a drain connected through the terminating impedance to the second end of the input transmission line, a source connected to the reference potential, and a gate connected to the reference potential through a resistance.

* * * * *